(12) United States Patent
Eyuboglu et al.

(10) Patent No.: US 6,397,095 B1
(45) Date of Patent: May 28, 2002

(54) MAGNETIC RESONANCE—ELECTRICAL IMPEDANCE TOMOGRAPHY

(75) Inventors: B. Murat Eyuboglu, Ankara (TR); John S. Leigh, Philadelphia; Ravinder Reddy, Phoenixville, both of PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 0 days.

(21) Appl. No.: 09/515,181

(22) Filed: Feb. 29, 2000

Related U.S. Application Data

(60) Provisional application No. 60/122,310, filed on Mar. 1, 1999.

(51) Int. Cl.[7] ........................... A61B 5/053; A61B 5/055
(52) U.S. Cl. ......................... 600/411; 600/549; 324/309
(58) Field of Search ................................. 600/410, 411, 600/547; 324/307, 309

(56) References Cited

PUBLICATIONS

"Anatomically Constrained Electrical Impedance Tomography for Anistropic Bodies via a Two–Step Approach," Michael Glidewell, IEEE Transactions Medical Imaging, vol. 14, No. 3, Sep. 1995.*

"Impedance Tomography Using Internal Current Density Distribution Measured by Nuclear Magnetic Resonance," Mathematical Methods in Medical Imaging III, Fred L. Bookstein et al., Proc. SPIE 2299, pp. 377–385 1994.*

Greg C. Scott, Michael L. G. Joy, Robin L. Armstrong, R. Mark Henkelman, "Rotating Frame RF Current Density Imaging," from *Magnetic Resonance in Medicine*, vol. 33, pp. 355–369, 1995.

\* cited by examiner

*Primary Examiner*—Marvin M. Lateef
*Assistant Examiner*—Runa Shah Qaderi
(74) *Attorney, Agent, or Firm*—Woodcock Washburn LLP

(57) ABSTRACT

A magnetic resonance-electrical impedance tomography (MREIT) technique for determining the local conductivity of an object. The MREIT technique combines magnetic resonance current density imaging (MRCDI) with electrical impedance tomography (EIT) in order to obtain the benefits of both procedures. The MREIT technique includes the step of current density imaging by performing the steps of placing a series of electrodes around the patient or object to be imaged for the application of current, placing the patient or object in a strong magnetic field, and applying an MR imaging sequence which is synchronized with the application of current through the electrodes. Next, the electric potentials of the surface of the object or patient are measured simultaneously with the MR imaging sequence, as in EIT. Then, the MR imaging signal containing information about the current and the measured potential are processed to calculate the internal conductivity (impedance) of the object or patient.

3 Claims, 3 Drawing Sheets

MAGNETIC RESONANCE— ELECTRICAL IMPEDANCE TOMOGRAPHY

This application claims benefits to U.S. Provisional application No. 60/122,310 filed Mar. 1, 1999.

GOVERNMENT SUPPORT

This invention was supported in part by funds from the U.S. Government (National Institutes of Health Grant No. RR02305) and the U.S. Government may therefore have certain rights in the invention.

BACKGROUND OF THE INVENTION

1. Field of the Invention

The present invention relates to a technique for determining the local conductivity of an object or patient by combining the techniques used for magnetic resonance current density imaging (MRCDI) with the techniques used for electrical impedance tomography (EIT).

2. Description of the Prior Art

The techniques of electrical impedance tomography (EIT) and magnetic resonance current density imaging (MRCDI) are generally known by those skilled in the art.

EIT (also called 'applied potential tomography') is a technique that determines the internal conductivity or impedance of a patient or an object by applying and measuring a surface current while simultaneously measuring the surface potential. EIT has applications in medicine and process control. The major limitations of EIT are its low spatial resolution, and, in the medical field, the large variability of images between subjects. Recordings are typically made by applying current to the body or object under test using a set of electrodes and measuring the voltage developed between other electrodes. To obtain reasonable images, at least one hundred, and preferably several thousand, such measurements must be made.

For medical applications, EIT produces images of the distribution of impedivity (or, more commonly, resistivity), or its variation with time or frequency, within the tissue of the patient. There is a large resistivity contrast (up to about 200:1) between a wide range of tissue types in the body, making it possible to use resistivity to form anatomical images. Furthermore, there is often a significant contrast between normal and pathological tissue. For example, it is known that, at 1 kHz, cerebral gliomas have a resistivity about half that of normal tissue. To measure resistivity or impedivity, an excitation current must flow in the tissue and the resulting voltages measured. In practice, almost all EIT systems use constant current sources, and measure voltage differences between adjacent pairs of electrodes. To obtain an image with good spatial resolution, a number of such measurements is required. This can be achieved by applying different current distributions to the body, and repeating the voltage measurements. From the set of measurements, an image reconstruction technique generates the tomographic image. Mathematically, the known quantities are the voltages and currents at certain points on the body; the unknown is the impedivity or resistivity within the body. At low frequencies, these quantities are related by Poisson's equation:

$$\nabla \cdot \sigma \nabla \phi = 0$$

where $\sigma$ is the conductivity (admittivity may be represented by a complex $\sigma$), $\phi$ is the potential and $\nabla$ is the Poisson operator, $\sigma$ and $\phi$ are spatial fields whose magnitudes are functions of position, and $\phi$ is also a non-linear function of $\sigma$. In practice, the solution of Poisson's equation is very sensitive to noise in the measurements, and normalization techniques must be used. Most in-vivo images have been produced using linearized, approximating techniques. These techniques attempt to find a solution for a small change in resistivity from a known starting value. Until recently, the change in resistivity was measured over time, and EIT images were inherently of physiological function. It is now possible to produce anatomical images using the same reconstruction technique, by imaging changes with frequency.

On the other hand, in MRCDI, static or radio-frequency currents are applied to the patient or object of interest so as to produce a magnetic field which can be imaged using conventional MRI techniques. A standard spin echo pulse sequence is used, with an addition of a bipolar current pulse. The flux density parallel to the main magnetic field, generated by the current pulse, is encoded in the phase of the complex MR image. The spatial distribution of magnetic flux density is then extracted from the phase image. Current density distribution generated by repetitive current flow synchronized to the imaging sequence is imaged, and current density is calculated by knowing the magnetic flux density.

Using MRCDI, current densities as low as 1 microamp/$mm^2$ can be imaged satisfactorily, even near the current carrying electrodes. To reconstruct the current density in one direction, components of magnetic flux density in at least two orthogonal directions are needed. Using MRCDI, only the B field component parallel to the main magnetic field can be imaged. Therefore, the sample must be rotated to align two of its axis with the direction of the main magnetic field, one axis at a time. This is the major limitation of the technique in applying it to human subjects or large samples. To overcome this limitation, Scott et al. in a paper entitled *Rotating Frame RF Current-Density Imaging*, Magnetic Resonance in Medicine, Vol. 33, pp. 355–369 (1995) implemented a technique in which current density at Larmor frequency and parallel to the main magnetic field can be imaged without rotating the sample to be imaged. However, imaging current densities at RF frequencies (e.g. approximately 86 MHZ at 2 Tesla) may not provide biologically useful information as much as dc current density imaging does. It is also possible to use open-magnet MR imaging systems to eliminate the problem of object rotation.

It is desired to simultaneously provide high-resolution images of impedance and of electrical current density images. It is also desired to image very low currents, on the order of 1 microamp/$mm^2$. The present invention has been designed to meet these needs in the art.

SUMMARY OF THE INVENTION

The above and other objects of the invention have been met by development of a technique, referred to herein as magnetic resonance-electrical impedance tomography (MREIT), for determining the local conductivity of an object. The MREIT technique of the invention combines magnetic resonance current density imaging (MRCDI) with electrical impedance tomography (EIT) in order to obtain the benefits of both procedures. In particular, the method of the invention includes the step of current density imaging by performing the steps of placing a series of electrodes around the patient or object to be imaged for the application of current, placing the patient or object in a strong magnetic field, and applying an MR imaging sequence which is synchronized with the application of current through the electrodes. The electric potentials of the surface of the object or patient are measured simultaneously with (or following) the MR imaging sequence, as in EIT. Then, the MR imaging signal containing information about the current and the measured potential are processed to calculate the internal conductivity (impedance) of the object or patient.

Determination of the local conductivity of the patient or object begins with a mapping of the current density for a particular pair of electrodes. The equi-potential lines are then determined using the measured surface potential data. These equi-potential lines represent an area with a constant potential and are substantially perpendicular to the current density lines. The gradient of the potential is then readily calculated from the equi-potentials.

The intersection of the constant current lines and the equi-potential lines form a grid, where the local impedance may be determined from the grid points by the relationship:

$$\vec{j}(x, y, z) = \sigma(x, y, z) \cdot \vec{\nabla}\phi(x, y, z)$$

where $$\vec{j}(x, y, z)$$

is the local current density, $\sigma(x,y,z)$ is the local impedance, and $$\vec{\nabla}\phi(x,y,z)$$

is the gradient of the potential.

In another approach, first an EIT image of the conductivity distribution is obtained. An iterative approach is adopted by taking the EIT image as an initial conductivity distribution $\sigma_i(x,y,z)$. For this conductivity distribution, the EIT forward problem is solved and the potential distribution $\phi(x,y,z)$ and gradient of the potential field $$\vec{\nabla}\phi(x, y, z)$$

are found. For a given conductivity distribution, (which can be assumed to be equal to $\sigma_i(x,y,z)$), the gradient of the potential field, $$\vec{\nabla}\phi(x, y, z),$$

can also be determined from MRCDI measurements. Minimizing the error between the two values of $$\vec{\nabla}\phi(x, y, z),$$

an optimum expression for $\sigma(x,y,z)$, is obtained. The algorithm is iterated for the new distribution of $\sigma(x,y,z)$, until a minimum error is obtained.

BRIEF DESCRIPTION OF THE DRAWINGS

The foregoing and other novel features and advantages of the invention will become more apparent and more readily appreciated by those skilled in the art after consideration of the following description in conjunction with the associated drawings, of which.

DETAILED DESCRIPTION OF THE PRESENTLY PREFERRED EMBODIMENTS

Figure 1:
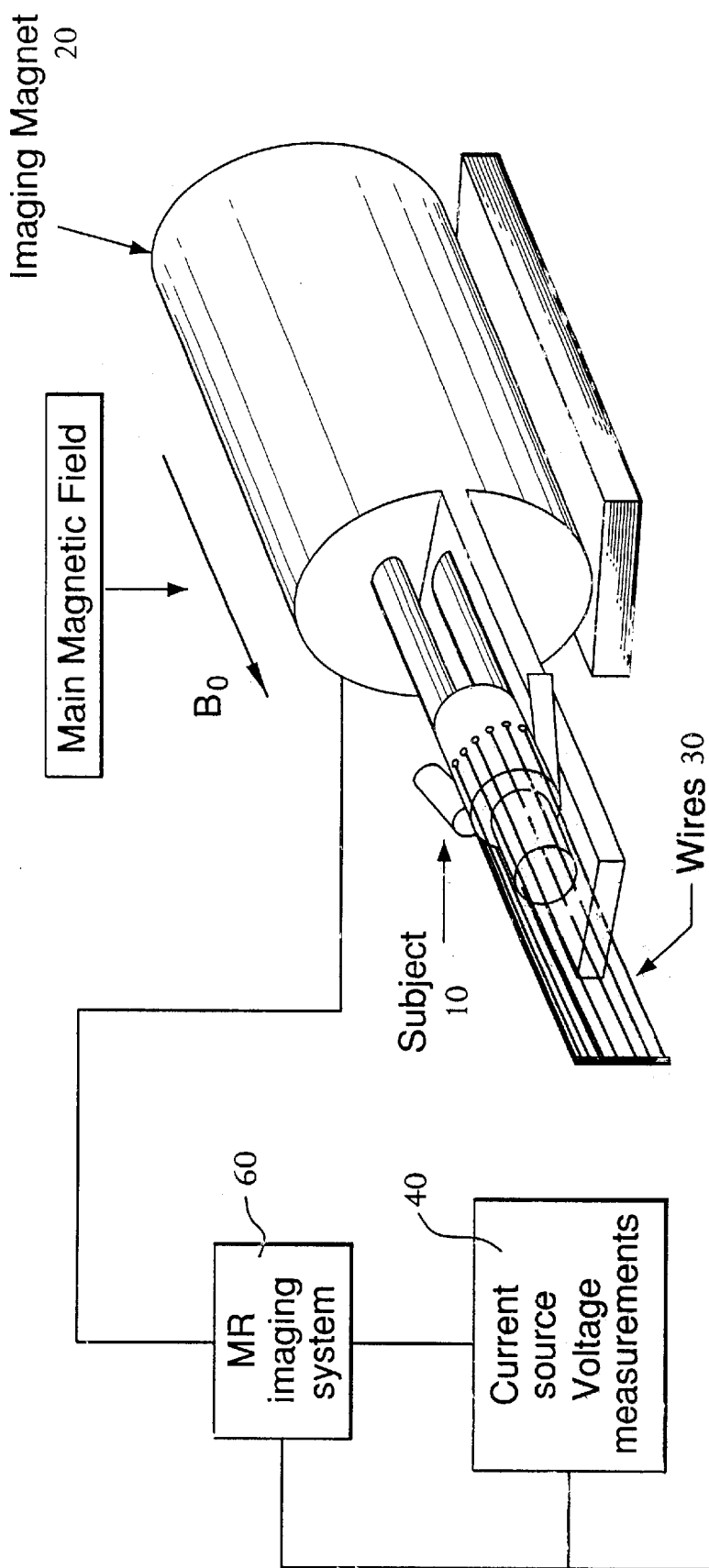
FIG. 1 illustrates a schematic representation of a MR-EIT system of the invention.

A preferred embodiment of the invention will now be described in detail with reference to FIGS. 1–3. Those skilled in the art will appreciate that the description given herein with respect to those figures is for exemplary purposes only and is not intended in any way to limit the scope of the invention. All questions regarding the scope of the invention may be resolved by referring to the appended claims.

Through combining Magnetic Resonance Current Density Imaging (MRCDI) and Electrical Impedance Tomography (EIT) for the first time, a new imaging technique called Magnetic Resonance-Electrical Impedance Tomography (MR-EIT) has been developed. MR-EIT is set up by positioning an array of electrodes along the surface of the object under study (e.g., on the skin of a human subject). As shown in FIG. 1, the object 10 is then placed in the middle of the strong magnetic field $B_0$ generated by a Magnetic Resonance Imaging (MRI) magnet 20. All wires 30 connected to these electrodes are shielded, and fixed properly to prevent them from moving. The voltage measurements are read by measurement circuitry 40. Voltage measurements are used to reconstruct images and the images are displayed on a display 50. Preferably, the electrodes are not magnetic and provide the means of introducing an electric current in the object. In a preferred embodiment, the application of current is synchronized with the MR imaging sequence from an MR imaging system 60. Using MRCDI, the spatial distribution of the current generated within the object and measured by measurement circuitry 40 is determined. At the same time, the potentials for the surface of the object are determined using the electrodes.

In accordance with the invention, information related to spatial current density is encoded within the complex magnetic resonance signal. By decoding this information, a numerical value for the current density is extracted. Methods have been developed by the inventors that make use of MRCDI to detect and quantify very low current densities (i.e., approximately 1 micro-Amp/mm$^2$). To image current density near the electrodes, copper or Ag—AgCl electrodes no thicker than 1 mm are used. In addition, a cosine RF coil is used to ensure homogeneous excitation throughout the sample.

Figure 2:
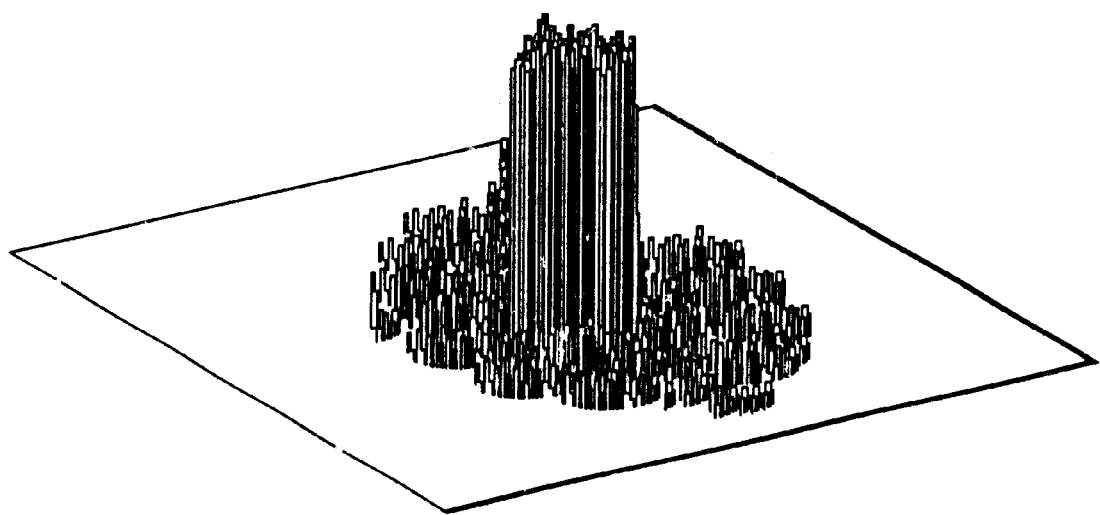
FIG. 2 illustrates an image of current density in a uniform current flow.
Figure 3:
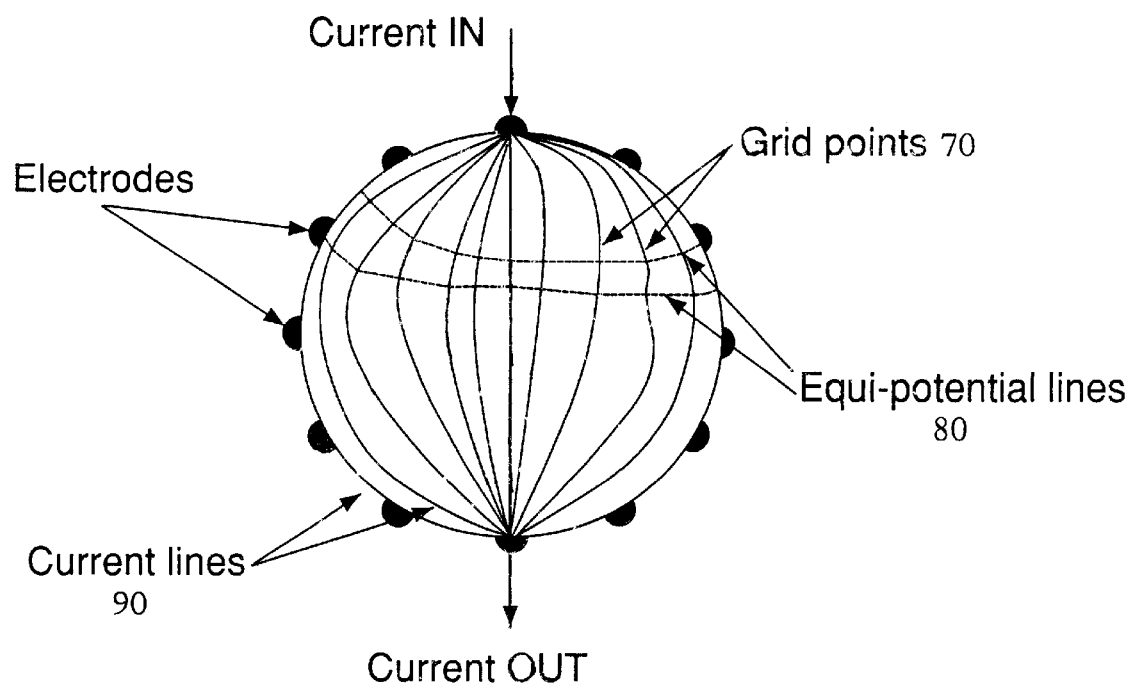
FIG. 3 illustrates the electrodes, equi-potential lines, and the internal grid points used to calculate a gradient of potential for the entire volume of interest.

From the measured MR data, spatial maps of current density as in FIG. 2 are generated. Current density can thus be measured throughout a given volume of interest. Current is applied between all possible electrode pairs, sequentially. For each current electrode pair, the electrode surface potentials of the object are measured. After determining current density, these potentials are projected back along lines orthogonal to orientation of current flow. Doing this permits the equi-potential lines to be determined. As shown in FIG. 3, the points 70 where the equi-potential lines 80 and the iso-current lines 90 intersect are defined on an internal grid. The potential corresponding to a given point of intersection 70 on the grid is equal to the potential defined by the equi-potential line passing through that point.

A gradient of potential for the entire volume of interest based on these potentials described by the grid may then be calculated. Once the current density.

and the potential gradient inside the volume conductor $$(\vec{\nabla}\phi(x, y, z))$$

are known, the local conductivity ($\sigma(x,y,z)$) of the volume may be determined as in equation (1):

$$\vec{j} = \sigma \cdot \vec{\nabla}\phi$$

This provides accurate and high resolution electrical impedance.

In another approach, first an EIT image of the conductivity distribution is obtained. An iterative approach is adopted by taking the EIT image as an initial conductivity distribution $\sigma_i(x,y,z)$. For this conductivity distribution, the EIT forward problem is solved and the potential distribution $\phi(x,y,z)$ and gradient of the potential field $$\vec{\nabla}\phi(x, y, z)$$

are found. For a given conductivity distribution, (which can be assumed to be equal to $\sigma_i(x,y,z)$), the gradient of the potential field, $$\vec{\nabla}\phi(x, y, z),$$

can also be determined from MRCDI measurements. Minimizing the error between the two values of $$\vec{\nabla}\phi(x, y, z),$$

an optimum expression for $\sigma(x,y,z)$, is obtained. The algorithm is iterated for the new distribution of $\sigma(x,y,z)$, until a minimum error is obtained.

Thus, the MR-EIT technique of the invention accomplishes the following two tasks: 1) the measurement of current density within a volume conductor, exploiting the presence of nuclear magnetic resonance active nuclei, and 2) the calculation of potential gradient within the volume conductor. From this data it is then possible to calculate the distribution of electrical conductivity throughout the conductor. If the conductivity is already known, then based on equation (1) the potential gradient at the same resolution as that of the current density may be calculated. This results in the accurate determination of lead-sensitivity fields for impedance measurements taken from the body.

The techniques of the invention may have applications in numerous areas.

For example, the invention may be used to address problems concerning bio-electric fields. Electrical Source Imaging (ESI) is a currently evolving method of monitoring brain and cardiac activity which involves measuring gradient potentials simultaneously on the surface of the head (EEG) and on the surface of the thorax (ECG). Currently, as many as 500 measurements may be obtained on a given occasion using this method. ESI requires the best knowledge available on the geometry of the regions under study (e.g., head and thorax), the electrical conductivity of the tissues internal to these regions, and the sensitivity of the electrodes to the sources. Through its ability to monitor the effects and metabolic activities of drugs, ESI may enhance several clinical protocols. These include diagnostic methods, therapeutic practices related to epilepsy and abnormalities in heart conduction, and the isolation of tissue abnormalities that may require surgical removal.

The invention may also be used for the determination of electrode lead sensitivities. Using the information obtained by MR-EIT, the extent of change in conductivity and potential inside the volume conductor can be gauged through measurements from the electrodes. The accurate, high-resolution maps of sensitivity that are thus generated lead to a corresponding improvement in the accuracy of EIT reconstruction and provide solutions to the problems of inversion in ESI.

The invention may further be used for the optimization of implantable defibrillation electrode positions. Implantable defibrillators are used on patients who are at high risk for cardiac fibrillation. Electrodes of an implantable defibrillator should be placed in such a way to achieve the maximum potential gradient possible in the myocardium while using the minimum amount of battery current. These procedures can be performed on computer models whose accuracy is directly related to that of the available information about geometry and about the in vivo conductivity of tissues. It is thus of obvious benefit to obtain tissue conductivities using MR-EIT for subsequent use in these models, and to image the densities of currents on biological models.

The present invention may also have utility for high-resolution conductivity imaging. As known to those skilled in the art, different tissues have different electrical conductivities. In addition, physiologic activities can effect changes in the conductivity of some tissues (e.g., respiration and blood perfusion affects the conductivity of lung tissue). The resistance of tissue may also be altered by certain pathologies. Therefore, MR-EIT can be used both to monitor physiologic activity and in the diagnosis of tissue abnormalities.

In a totally different type of application, MR-EIT may also be used to probe the earth and so to produce high-resolution images of geologic strata. Generally, the technique of the invention may be applied to image layers of the earth and to analyze the composition of these layers based on their electrical properties. Impedance imaging techniques provide unique information which cannot be obtained by other means of measurement.

Thus, the MR-EIT imaging technique of the invention simultaneously provides high-resolution images of impedance and of electrical current density images. Impedance images generated with conventional EIT demonstrate very poor resolution (i.e., 10% of the diameter of the imaged object) and they are not quantitatively accurate. MR-EIT images demonstrate much better resolution (i.e., millimeters) and greater accuracy than EIT images. On the other hand, MRCDI alone can only provide images of current density, while the method of the invention also provides information about impedance. MR-EIT provides unique insight into electrical properties of biological tissues and is thus more comprehensive than its component techniques MRI and EIT and in certain ways more accurate and reliable as an imaging method of measurement.

As noted above, the present invention also improves upon the traditional MRCDI technique of measurement by using thin, non-magnetic electrodes and shielded wires that lead away from the object in a direction parallel to the main magnetic field. This allows the imaging of very low currents, on the order of 1 micro-Amp/mm$^2$. This amplitude is half that of currents imaged in previous studies of MRCDI. The image current densities next to the electrodes may also be measured, which researchers until now have not done.

Those skilled in the art will also appreciate that numerous other modifications to the invention are possible within the scope of the invention. Accordingly, the scope of the invention is not intended to be limited to the preferred embodiment described above, but only by any appended claims.

We claim:

1. A method of performing electrical impedance tomography of an object using magnetic resonance (MR), comprising the steps of:

imaging a current density of said object by performing the steps of placing a series of electrodes around said object, placing said object in a magnetic field, applying a current through said electrodes, and applying an MR imaging sequence which is synchronized with the application of current through the electrodes, simultaneously measuring electric potentials of a surface of said object caused by the application of current through the electrodes and an MR imaging signal caused by the MR imaging sequence;

processing the MR imaging signal to calculate an internal impedance of said object, said MR signal containing information about the current and the measured potential from which to determine said internal impedance; and determining a local impedance of the object by performing the steps of mapping the current density for a particular pair of electrodes, determining equi-potential lines using said measured electric potentials, said equi-potential lines representing an area with a constant potential and being substantially perpendicular to current density lines of said object in said magnetic field, and calculating a gradient of electrical potential from the equi-potentials.

2. A method as in claim 1, wherein said gradient calculating step comprises the steps of determining intersections of constant current density lines on said object and the equi-potential lines so as to form a grid, and determining the local impedance from the grid points by the relationship:

$$(x,y,z)=\sigma(x,y,z)\cdot(x,y,z)$$

where $(x,y,z)$ is the local current density, $\sigma(x,y,z)$ is the local impedance, and $\phi(x,y,z)$ is the gradient of the electrical potential.

3. A method as in claim 1, comprising the further step of determining conductivity distribution of the object by performing the steps of:

(a) reconstructing an initial conductivity distribution $\sigma_i(x,y,z)$ using said measured electric potentials;

(b) determining a potential field inside the object and a gradient of said potential field using said initial conductivity distribution $\sigma_i(x,y,z)$;

(c) determining a gradient of the conductivity distribution of the object from said MR signal;

(d) minimizing an error between the potential gradient found using said measured electric potentials in step (b) and the potential gradient found from the MR signal in step (c) to find an optimum conductivity distribution $\sigma(x,y,z)$; and (e) if said error is larger than a predetermined value, replacing the initial conductivity distribution $\sigma_i(x,y,z)$ with the optimum conductivity distribution $\sigma(x,y,z)$ and repeating steps (a)–(d) until a minimum error is obtained.

* * * * *

UNITED STATES PATENT AND TRADEMARK OFFICE
CERTIFICATE OF CORRECTION

PATENT NO.     : 6,397,095 B1
DATED          : May 28, 2002
INVENTOR(S)    : Eyuboglu et al.

It is certified that error appears in the above-identified patent and that said Letters Patent is hereby corrected as shown below:

Column 8,
Line 10, please delete the following equation: "$(x,y,z) = \sigma(x,y,z) \cdot (x,y,z)$" and replace with the following equation: -- $(x,y,z) = \sigma(x,y,z) \; \varphi(x,y,z)$ --

Signed and Sealed this

Eighteenth Day of February, 2003

JAMES E. ROGAN
*Director of the United States Patent and Trademark Office*